US012567370B2

(12) United States Patent
Morita et al.

(10) Patent No.: US 12,567,370 B2
(45) Date of Patent: Mar. 3, 2026

(54) DISPLAY DEVICE

(71) Applicant: Magnolia White Corporation, Tokyo (JP)

(72) Inventors: Tetsuo Morita, Tokyo (JP); Hiroshi Tabatake, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 0 days.

(21) Appl. No.: 18/931,526

(22) Filed: Oct. 30, 2024

(65) Prior Publication Data

US 2025/0140190 A1 May 1, 2025

(30) Foreign Application Priority Data

Oct. 30, 2023 (JP) .................................. 2023-185593

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01); *G09G 2300/0452* (2013.01); *G09G 2300/0819* (2013.01); *G09G 2300/0842* (2013.01); *G09G 2310/08* (2013.01)

(58) Field of Classification Search
CPC ............... G09G 3/3677; G09G 3/3696; G09G 2300/0417; G09G 2300/0426; G09G 2310/0286; G09G 2310/08; G09G 2330/021; H03K 17/161; H03K 3/012
See application file for complete search history.

(56) References Cited

U.S. PATENT DOCUMENTS

| | | | | |
|---|---|---|---|---|
| 12,094,416 | B1 * | 9/2024 | Chen ................... | H10K 59/1213 |
| 2018/0061317 | A1 | 3/2018 | Morita et al. | |
| 2019/0214447 | A1 * | 7/2019 | Kim ................... | H10K 59/1213 |
| 2020/0410934 | A1 * | 12/2020 | Jeon ................... | H10K 59/1216 |
| 2021/0110763 | A1 | 4/2021 | Morita et al. | |
| 2023/0035245 | A1 | 2/2023 | Lin et al. | |
| 2023/0206788 | A1 * | 6/2023 | Yang ..................... | G09F 9/3026 |
| | | | | 257/79 |

FOREIGN PATENT DOCUMENTS

| | | | | |
|---|---|---|---|---|
| JP | 2018036290 | A | 3/2018 | |
| JP | 2019211665 | A | 12/2019 | |
| WO | WO-2025043620 | A1 * | 3/2025 | ........... G09G 3/3233 |

OTHER PUBLICATIONS

Extended European Search Report issued Feb. 13, 2025, in corresponding EP Application No. 24209620.4, 10pp.
Communication pursuant to Article 94(3) EPC issued Nov. 20, 2025, in EP Application No. 24 209 620.4, 9 pages.

* cited by examiner

*Primary Examiner* — Stacy Khoo
(74) *Attorney, Agent, or Firm* — XSENSUS LLP

(57) ABSTRACT

A display device can include a base, a plurality of pixels arranged in a display area on the base, and a data signal line supplying a data signal to each of the plurality of pixels. Each of the plurality of pixels can include a pixel circuit including a plurality of transistors and a light emitting element driven by the pixel circuit. The pixel circuit can drive the light emitting element to emit light in time division. The first transistor can be connected to the data signal line, among the plurality of transistors including the pixel circuit, can be an oxide transistor.

14 Claims, 12 Drawing Sheets

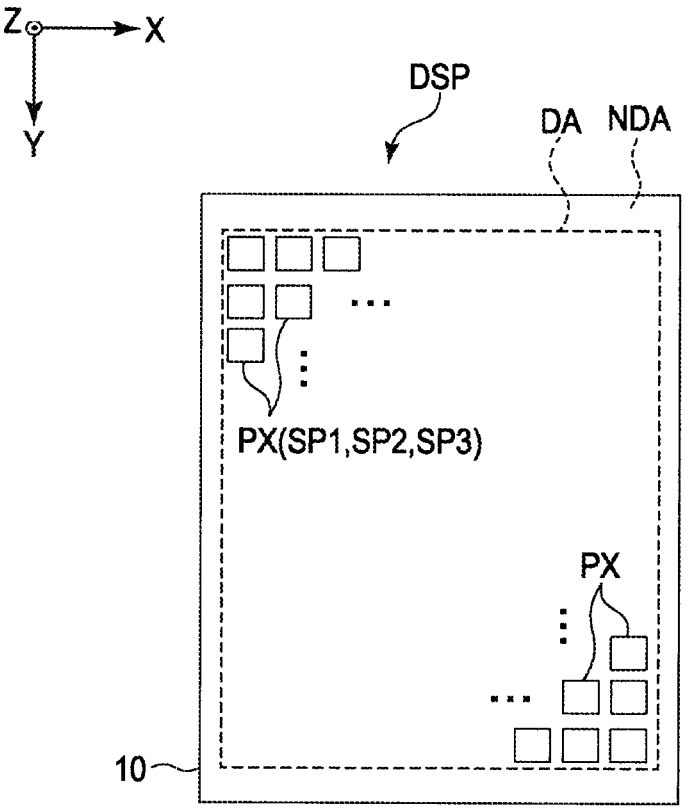
F I G. 1

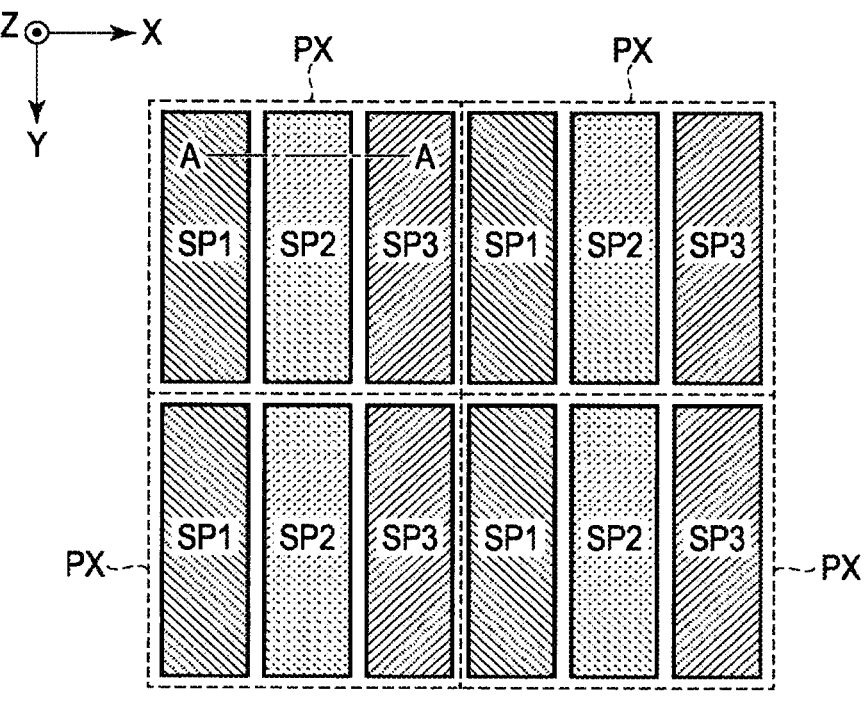
F I G. 2
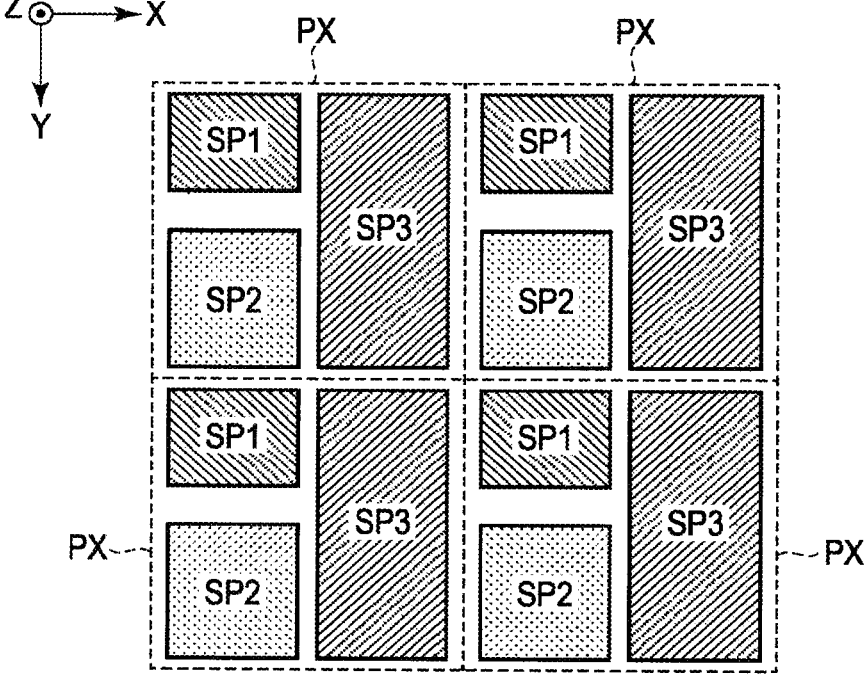
F I G. 3

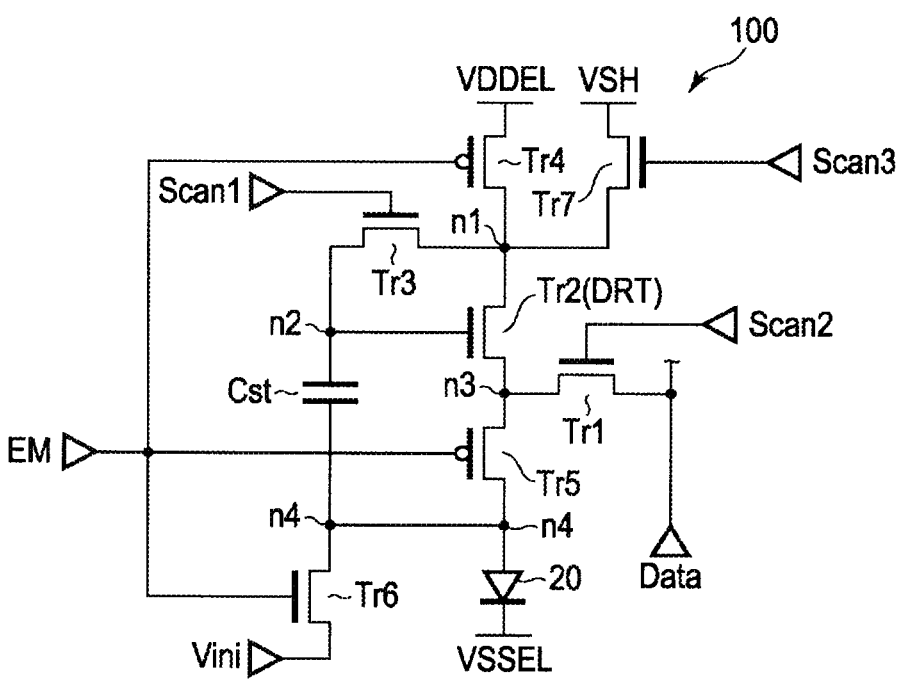
F I G. 9

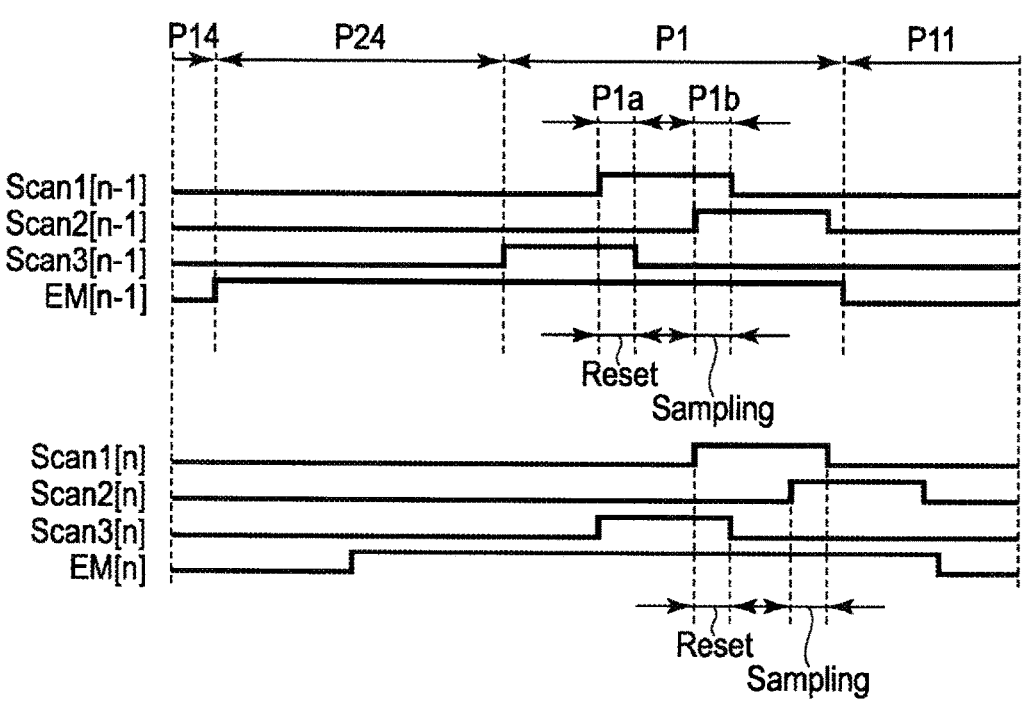
F I G. 11
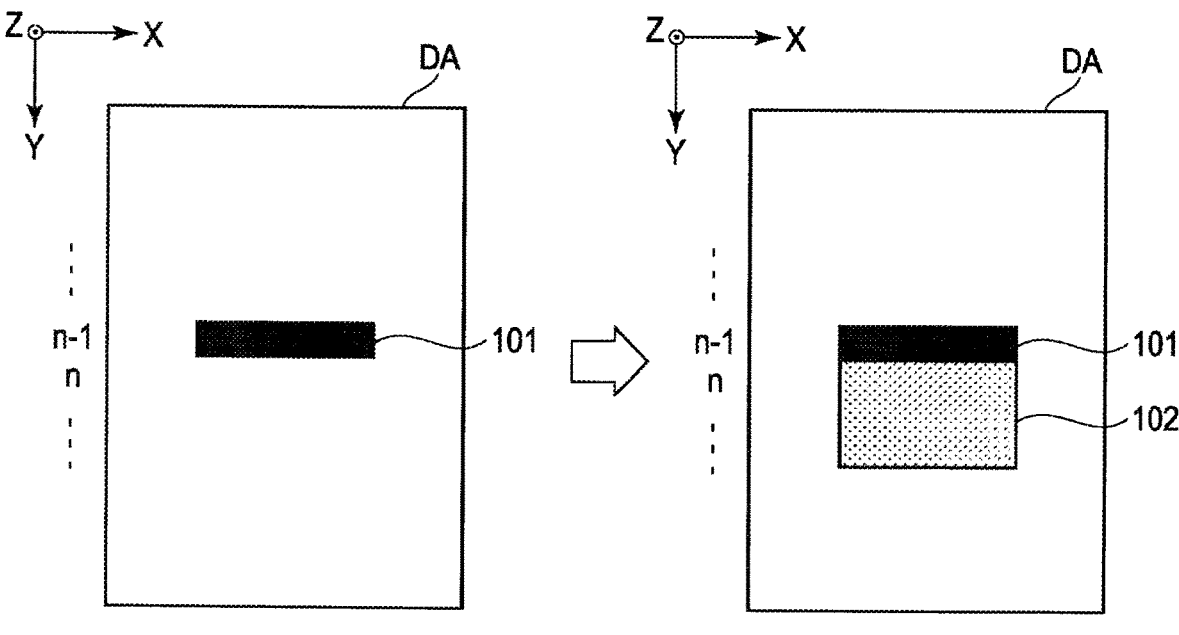
F I G. 12

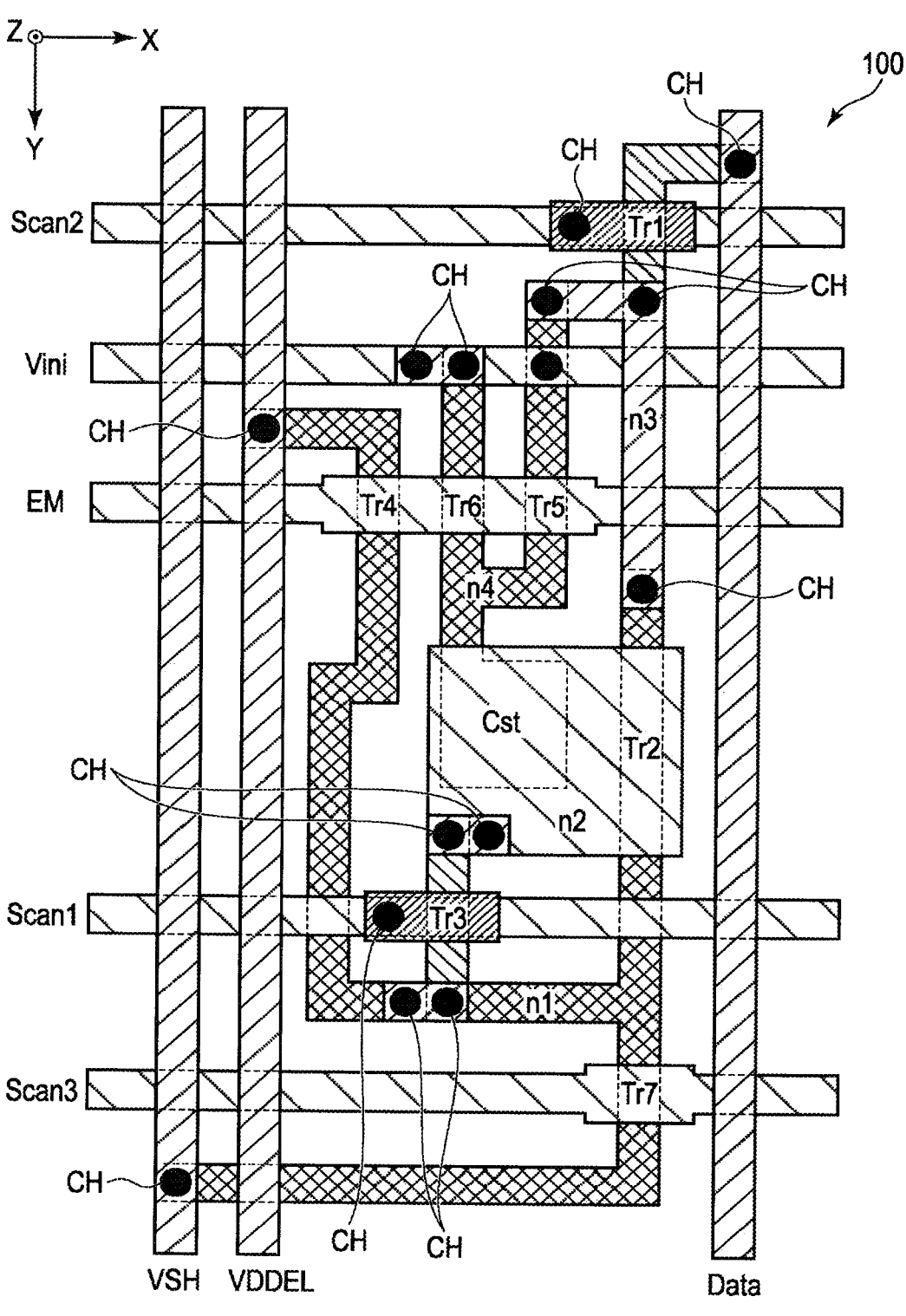
F I G. 14

DISPLAY DEVICE

CROSS-REFERENCE TO RELATED APPLICATION

This application is based upon and claims the benefit of priority from Japanese Patent Application No. 2023-185593, filed Oct. 30, 2023; the entire contents of which are incorporated herein by reference.

FIELD

Embodiments described herein relate generally to a display device.

BACKGROUND

Recently, display devices equipped with organic light-emitting diodes (OLED), which are light emitting elements functioning as display elements, have been put into practical use.

SUMMARY

In general, according to at least one embodiment, a display device can include a base, a plurality of pixels arranged in a display area on the base, and a data signal line supplying a data signal to each of the plurality of pixels. Each of the plurality of pixels includes a pixel circuit including a plurality of transistors and a light emitting element driven by the pixel circuit. The pixel circuit is configured to drive the light emitting element to emit light in time division. The first transistor connected to the data signal line, among the plurality of transistors in the pixel circuit, is an oxide transistor.

According to another aspect, a display device can comprise: a base; a plurality of pixels in a display area (DA) on the base; and a data signal line to supply a data signal to each of the plurality of pixels, wherein each of the plurality of pixels includes a pixel circuit having a plurality of transistors and a light emitting element drivable by the pixel circuit, the pixel circuit is configured to drive the light emitting element to emit light according to pulse width modulation, a first transistor is connected to the data signal line, among the plurality of transistors in the pixel circuit, the plurality of transistors include a second transistor to supply current to the light emitting element, and the first transistor has a smaller leak current compared to the second transistor.

BRIEF DESCRIPTION OF THE DRAWINGS

FIG. 1 is a view showing a configuration example of a display device of an embodiment.

FIG. 2 is a view showing an example of layout of a plurality of subpixels included in a pixel.

FIG. 3 is a view showing another example of the layout of a plurality of subpixels included in a pixel.

FIG. 9 is a view illustrating an example of a circuit configuration of a pixel circuit.

FIG. 11 is a view illustrating an operation of the PWM drive of a pixel circuit.

FIG. 12 is a view illustrating the display quality of the display device to which PWM drive is applied.

FIG. 14 is a view showing an example of the layout of the pixel circuit.

DETAILED DESCRIPTION

Figure 4:
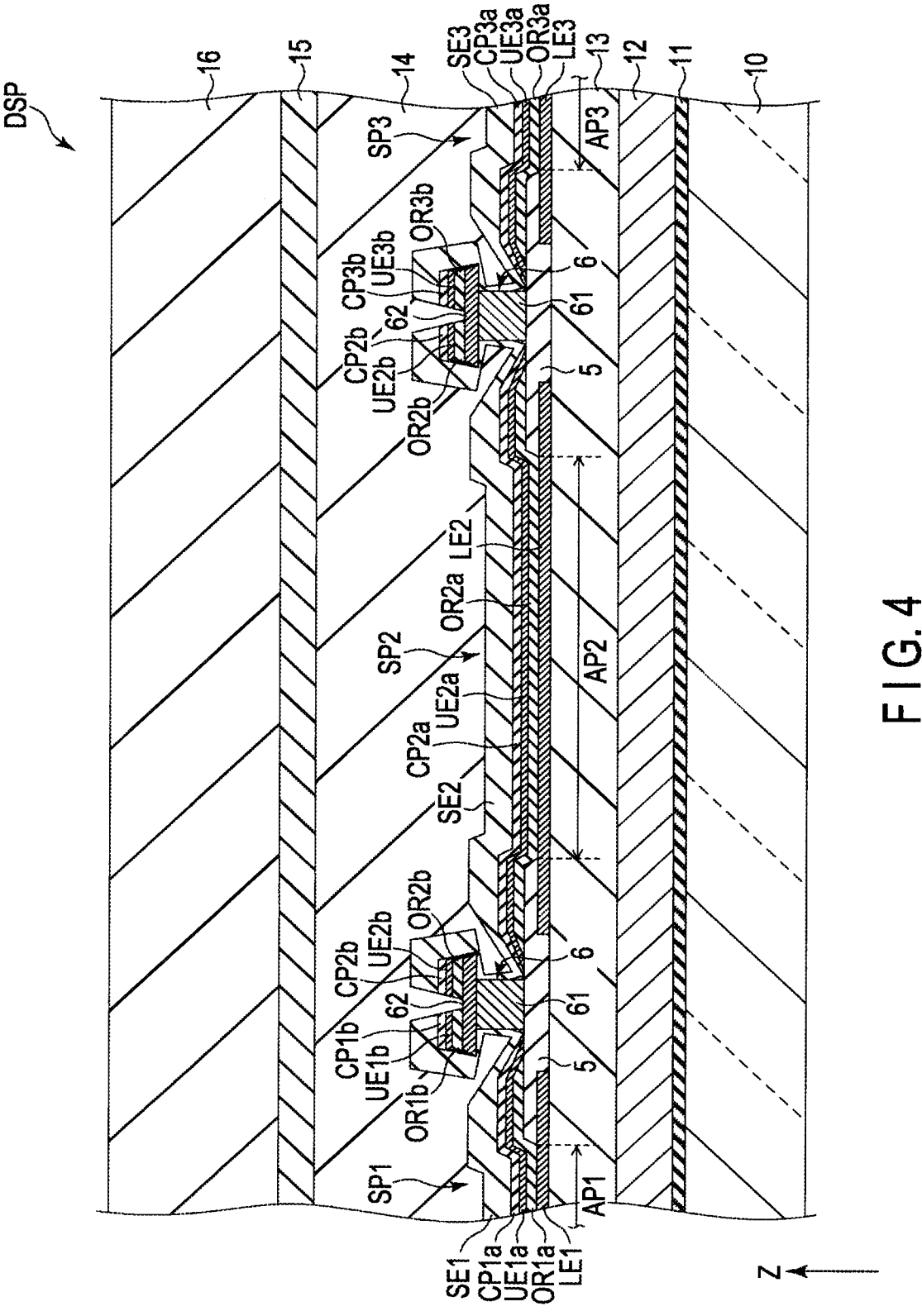
FIG. 4 is a schematic cross-sectional view showing the display device along A-A line in FIG. 2.

One or more embodiments will be described hereinafter with reference to the accompanying drawings.

In a display device, the light-emitting elements can be driven by pixel circuits, and a configuration according to one or more embodiments of the present disclosure can improve the yield of the display device.

The present disclosure presents examples, and proper changes within the spirit of the present disclosure. In addition, in some cases, in order to make the description clearer, the widths, thicknesses, shapes and the like, of the respective parts are schematically illustrated in the drawings, compared to the actual modes. However, the schematic illustration is merely an example, and adds no restriction to the interpretation of the present disclosure, including embodiments thereof. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a first direction X, a direction along the Y-axis is referred to as a second direction Y, and a direction along the Z-axis is referred to as a third direction Z. In addition, viewing various elements parallel to the third direction Z is referred to as plan view.

The display device according to the present embodiment can be an organic electroluminescent display device including organic light emitting diodes (OLED) as display elements (light emitting elements), and is mounted on televisions, personal computers, mobile terminals, mobile phones, and the like.

FIG. 1 is a view showing a configuration example of a display device DSP according to the present embodiment. The display device DSP has a display area DA where images are displayed and a non-display area NDA around the display area DA, on an insulating base 10. The base 10 may be glass or a flexible resin film.

In the present embodiment, the shape of the base 10 in plan view is a rectangular shape. However, the shape of the base 10 in plan view is not limited to a rectangular shape, but may also be the other shape such as a square, a circle or an ellipse.

The display area DA includes a plurality of pixels PX arrayed (arranged) in a matrix in the first direction X and the second direction Y. Each of the pixels PX includes a plurality of subpixels SP. In one example, the plurality of subpixels SP include red subpixels SP1, green subpixels SP2, and blue subpixels SP3. Incidentally, the plurality of subpixels SP may include subpixels of the other color such as white in addition to the subpixels SP1, SP2, and SP3. Incidentally, the plurality of subpixels SP may include subpixels of the other color instead of any subpixels of the subpixels SP1, SP2, and SP3.

Incidentally, as described in more detail below, each of the plurality of subpixels SP includes a pixel circuit and a light emitting element driven by the pixel circuit. The pixel circuit is composed of, for example, a plurality of transistors (switching elements composed of thin-film transistors), and the like. The light emitting element is the above-described organic light emitting diode. For example, the subpixel SP1 includes a light emitting element that emits light so as to emit light of a red wavelength range, the subpixel SP2 includes a light emitting element that emits light so as to emit light of a green wavelength range, and the subpixel SP3 includes a light emitting element that emits light so as to emit light of a blue wavelength range.

FIG. 2 shows an example of a layout of the plurality of subpixels SP (SP1, SP2, and SP3) included in the pixel PX. Four pixels PX are focused in this example.

Each of the subpixels SP1, SP2, and SP3 constituting one pixel PX are formed in a substantially rectangular shape extending in the second direction Y, and the subpixels are arranged in the first direction X. When two pixels PX arranged in the first direction X are focused, the colors displayed in the subpixels SP adjacent in the first direction X are different from each other. In addition, when two pixels PX arranged in the second direction Y are focused, the colors displayed in the subpixels SP adjacent in the second direction Y are the same. Incidentally, the area of the subpixels SP1, SP2, and SP3 may be the same or different from each other.

FIG. 3 shows another example of the layout of the plurality of subpixels (SP1, SP2, and SP3) included in the pixels PX.

The subpixels SP1 and SP2 constituting one pixel PX are arranged in the second direction Y, the subpixels SP1 and SP3 are arranged in the first direction X, and the subpixels SP2 and SP3 are arranged in the first direction X. The subpixel SP1 is formed in a substantially rectangular shape extending in the first direction X, and the subpixels SP2 and SP3 are formed in a substantially rectangular shape extending in the second direction Y. The area of the subpixel SP2 is larger than the area of the subpixel SP1, and the area of the subpixel SP3 is larger than the area of the subpixel SP2. Incidentally, the shape and area of the subpixel SP1 may be the same as those of the subpixel SP2.

When two pixels PX arranged in the first direction X are focused, the colors displayed in the subpixels SP adjacent in the first direction X different from each other in the area where the subpixels SP1 and SP3 are provided alternately and the area where the subpixels SP2 and SP3 are provided alternately. In contrast, when two pixels PX arranged in the second direction Y are focused, the colors displayed in the subpixels SP adjacent in the second direction Y are different from each other in the area where the subpixels SP1 and SP2 are provided alternately. In addition, the colors displayed in the subpixels SP adjacent in the second direction Y are the same in the area where the plurality of subpixels SP3 are arranged.

Incidentally, the outer shape of the subpixels SP1, SP2 and SP3 shown in FIG. 2 and FIG. 3 correspond to the outer shape of the area (i.e., the light emitting area) where colors are displayed in the subpixels SP, but the shape is simplified and does not necessarily reflect the actual shape.

As described in more detail below, a rib and a partition are provided in the display area DA in the present embodiment.

The rib includes an aperture in each of the subpixels SP1, SP2 and SP3. The partition is provided on a boundary between adjacent subpixels SP and overlaps with the rib in plan view. More specifically, the partition is provided between the apertures (subpixels SP) that are adjacent in the first direction X and between the apertures (subpixels SP) that are adjacent in the second direction Y. As a result, the partition has a grating shape formed to partition the subpixels SP1, SP2, and SP3 as a whole. In other words, the partition is considered to include apertures at the subpixels SP1, SP2, and SP3, similarly to the rib.

FIG. 4 is a schematic cross-sectional view showing the display device DSP along A-A line in FIG. 2. In the display device DSP, insulating layer 11 referred to as an undercoat layer is provided on the above-described light-transmissive base 10 such as glass (i.e., on the surface of the side where the light emitting elements, and the like are provided).

The insulating layer 11 has, for example, a three-layer stacked structure with a silicon oxide film (SiO), a silicon nitride film (SiN), and a silicon oxide film (SiO). Incidentally, the insulating layer 11 is not limited to a three-layer stacked structure. The insulating layer 11 may have a stacked structure with more than three layers or may have a single-layer structure or a two-layer stacked structure.

A circuit layer 12 is provided on the insulating layer 11. The circuit layer 12 includes pixel circuits (various circuits and wires) that drives the light emitting elements included in each of the subpixels SP1, SP2, and SP3, as described above. The circuit layer 12 is covered with an insulating layer 13.

The insulating layer 13 functions as a planarization film which planarizes uneven parts generated by the circuit layer 12. Although not shown in FIG. 4, contact holes for connecting lower electrodes LE to the pixel circuit are provided in the insulating layer 13.

The lower electrodes LE (LE1, LE2, and LE3) are provided on the insulating layer 13. The rib 5 is provided on the insulating layer 13 and the lower electrodes LE. End portions (parts) of the lower electrodes LE are covered with the rib 5.

The partition 6 includes a lower portion 61 provided on the rib 5 and an upper portion 62 that covers an upper surface of the lower portion 61. The upper portion 62 has a width greater than that of the lower portion 61 in the first direction X and the second direction Y. As a result, the partition 6 has a shape in which both end portions of the upper portion 62 protrude beyond side surfaces of the lower portion 61. This shape of the partition 6 may be referred to as an overhang shape.

The organic layers OR (OR1, OR2 and OR3) and the upper electrodes UE (UE1, UE2 and UE3) constitute the light emitting elements included in the subpixels SP with the above-described lower electrodes LE (LE1, LE2 and LE3).

As shown in FIG. 4, the organic layer OR1 includes a first organic layer OR1a and a second organic layer OR1b that are separated from each other. The upper electrode UE1 includes a first upper electrode UE1a and a second upper electrode UE1b that are separated from each other. The first organic layer OR1a is in contact with the lower electrode LE1 through the aperture AP1 (i.e., an aperture of the rib 5 in the subpixel SP1) and covers a part of the rib 5. The second organic layer OR1b is located on the upper portion 62. The first upper electrode UE1a is opposed to the lower electrode LE1 and covers the first organic layer OR1a. Furthermore, the first upper electrode UE1a is in contact with side surfaces of the lower portion 61. The second upper electrode UE1b is located above the partition 6 and covers the second organic layer OR1b.

In addition, as shown in FIG. 4, the organic layer OR2 includes a first organic layer OR2_a_ and a second organic layer OR2_b_ that are separated from each other. The upper electrode UE2 includes a first upper electrode UE2_a_ and a second upper electrode UE2_b_ that are separated from each other. The first organic layer OR2_a_ is in contact with the lower electrode LE2 through the aperture AP2 (i.e., an aperture of the rib 5 in the subpixel SP2) and covers a part of the rib 5. The second organic layer OR2_b_ is located on the upper portion 62. The first upper electrode UE2_a_ is opposed to the lower electrode LE2 and covers the first organic layer OR2_a_. Furthermore, the first upper electrode UE2_a_ is in contact with side surfaces of the lower portion 61. The second upper electrode UE2_b_ is located above the partition 6 and covers the second organic layer OR2_b_.

In addition, as shown in FIG. 4, the organic layer OR3 includes a first organic layer OR3_a_ and a second organic layer OR3_b_ that are separated from each other. The upper electrode UE3 includes a first upper electrode UE3_a_ and a second upper electrode UE3_b_ that are separated from each other. The first organic layer OR3_a_ is in contact with the lower electrode LE3 through the aperture AP3 (i.e., an aperture of the rib 5 in the subpixel SP3) and covers a part of the rib 5. The second organic layer OR3_b_ is located on the upper portion 62. The first upper electrode UE3_a_ is opposed to the lower electrode LE3 and covers the first organic layer OR3_a_. Furthermore, the first upper electrode UE3_a_ is in contact with the side surfaces of the lower portion 61. The second upper electrode UE3_b_ is located above the partition 6 and covers the second organic layer OR3_b_.

In the example shown in FIG. 4, the subpixels SP1, SP2 and SP3 include cap layers CP1, CP2, and CP3 (optical path adjustment layers) for adjusting the optical property of the light emitted from light emitting layers of the organic layers OR1, OR2, and OR3.

The cap layer CP1 includes a first cap layer CP1_a_ and a second cap layer CP1_b_ that are separated from each other. The first cap layer CP1_a_ is located in the aperture AP1 and is provided on the first upper electrode UE1_a_. The second cap layer CP1_b_ is located above the partition 6 and is provided on the second upper electrode UE1_b_.

The cap layer CP2 includes a first cap layer CP2_a_ and a second cap layer CP2_b_ that are separated from each other. The first cap layer CP2_a_ is located in the aperture AP2 and is provided on the first upper electrode UE2_a_. The second cap layer CP2_b_ is located above the partition 6 and is provided on the second upper electrode UE2_b_.

The cap layer CP3 includes a first cap layer CP3_a_ and a second cap layer CP3_b_ that are separated from each other. The first cap layer CP3_a_ is located in the aperture AP3 and is provided on the first upper electrode UE3_a_. The second cap layer CP3_b_ is located above the partition 6 and is provided on the second upper electrode UE3_b_.

Sealing layers SE1, SE2 and SE3 are provided in subpixels SP1, SP2 and SP3, respectively. The sealing layer SE1 continuously covers the members of the subpixel SP1 including the first cap layer CP1_a_, the partition 6, and the second cap layer CP1_b_. The sealing layer SE2 continuously covers the members of the subpixel SP2 including the first cap layer CP2_a_, the partition 6, and the second cap layer CP2_b_. The sealing layer SE3 continuously covers the members of the subpixel SP3 including the first cap layer CP3_a_, the partition 6, and the second cap layer CP3_b_.

In the example shown in FIG. 4, the second organic layer OR1_b_, the second upper electrode UE1_b_, the second cap layer CP1_b_, and the sealing layer SE1 on the partition 6 between the subpixels SP1 and SP2 are separated from the second organic layer OR2_b_, the second upper electrode UE2_b_, the second cap layer CP2_b_, and the sealing layer SE2 on the partition 6. In addition, the second organic layer OR2_b_, the second upper electrode UE2_b_, the second cap layer CP2_b_, and the sealing layer SE2 on the partition 6 between the subpixels SP2 and SP3 are separated from the second organic layer OR3_b_, the second upper electrode UE3_b_, the second cap layer CP3_b_, and the sealing layer SE3 on the partition 6.

The sealing layers SE1, SE2 and SE3 are covered with a resin layer 14 (planarization film). The resin layer 14 is covered with a sealing layer 15. Furthermore, the sealing layer 15 is covered with a resin layer 16.

The insulating layer 13 and the resin layers 14 and 16 are formed of organic materials. The rib 5, and the sealing layers 15 and SE (SE1, SE2, and SE3) are formed of, for example, an inorganic material such as silicon nitride (SiNx).

The lower portion 61 included in the partition 6 is conductive. The upper portion 62 included in the partition 6 may also be conductive. The lower electrode LE may be formed of a transparent conductive oxide such as indium tin oxide (ITO) or may have a stacked structure of a metal material such as silver (Ag) and a conductive oxide. The upper electrode UE may be formed of a conductive oxide such as ITO.

When the potential of the lower electrode LE is relatively higher than the potential of the upper electrode UE, the lower electrode LE corresponds to an anode and the upper electrode UE corresponds to a cathode. In addition, when the potential of the upper electrode UE is relatively higher than the potential of the lower electrode LE, the upper electrode UE corresponds to an anode and the lower electrode LE corresponds to a cathode.

The organic layer OR includes a pair of functional layers, and a light emitting layer provided between these functional layers. In an example, the organic layer OR has a structure in which a hole-injection layer, a hole-transport layer, an electron blocking layer, a light emitting layer, a hole blocking layer, an electron-transport layer, and an electron-injection layer are stacked in this order.

The cap layers CP (CP1, CP2, and CP3) are formed of, for example, a multilayer body of a plurality of transparent thin films. The multilayer body may include a thin film formed of an inorganic material and a thin film formed of an organic material as the plurality of thin films. In addition, these thin films have refractive indices different from each other. The materials of the thin films constituting the multilayer body are different from the materials of the upper electrode UE and are also different from the materials of the sealing layer SE. Incidentally, the cap layers CP may be omitted.

A common voltage is supplied to the partition 6. This common voltage is supplied to each of the upper electrodes UE (first upper electrodes UE1_a_, UE2_a_, and UE3_a_) that are in contact with the side surfaces of the lower portion 61. A pixel voltage is supplied to the lower electrodes LE (LE1, LE2, and LE3) through the pixel circuits included in the respective subpixels SP (SP1, SP2, and SP3).

When a potential difference is formed between the lower electrode LE1 and the upper electrode UE1, the light emitting layer of the first organic layer OR1_a_ emits light in the red wavelength range. When a potential difference is formed between the lower electrode LE2 and the upper electrode UE2, the light emitting layer of the first organic layer OR2_a_ emits light in the green wavelength range. When a potential difference is formed between the lower electrode LE3 and the upper electrode UE3, the light emitting layer of the first organic layer OR3_a_ emits light in the blue wavelength range.

As another example, the light emitting layers of the organic layers OR1, OR2, and OR3 may emit light exhibiting the same color (for example, white). In this case, the display device DSP may include color filters that convert the light emitted from the light emitting layers into light exhibiting colors corresponding to the subpixels SP1, SP2, and SP3. In addition, the display device DSP may include a layer including quantum dots that are excited by the light emitted from the light emitting layers to generate the light of the colors corresponding to the subpixels SP1, SP2, and SP3.

Figure 5:
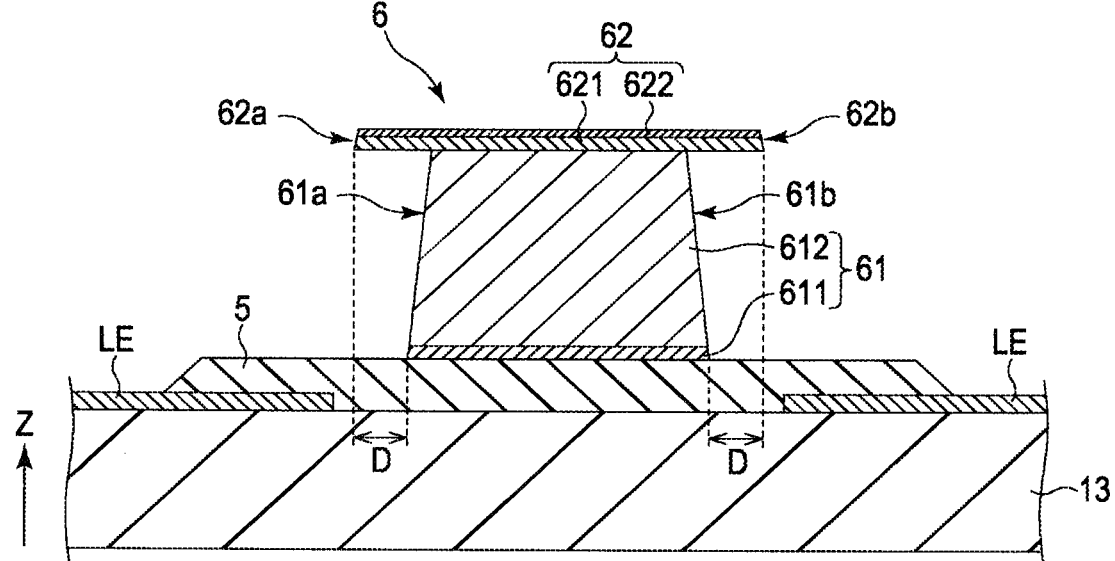
FIG. 5 is a schematic enlarged cross-sectional view showing a partition.

FIG. 5 is a schematic enlarged cross-sectional view of the partition 6. In FIG. 5, the elements other than the rib 5, the partition 6, the insulating layer 13 and a pair of lower electrodes LE are omitted. Each of the pair of lower electrodes LE corresponds to one of the above-described lower electrodes LE1, LE2 and LE3.

In the example shown in FIG. 5, the lower portion 61 of the partition 6 includes a barrier layer (bottom portion) 611 provided on the rib 5, and a metal layer (stem portion) 612 provided on the barrier layer 611. The barrier layer 611 is formed of a material that is different from the material of the metal layer 612, and is formed of, for example, a metal material such as molybdenum (Mo), titanium (Ti), and titanium nitride (TiN). The metal layer 612 is formed to be thicker than the barrier layer 611. The metal layer 612 may have a single-layer structure or multilayer structure of different metal materials. In one example, the metal layer 612 is formed of, for example, aluminum (Al).

The upper portion (top portion) 62 is thinner than the lower portion 61. In the example shown in FIG. 5, the upper portion 62 includes a first layer 621 provided on the metal layer 612, and a second layer 622 provided on the first layer 621. In one example, the first layer 621 is formed of, for example, titanium (Ti) and the second layer 622 is formed of, for example, ITO.

In the example shown in FIG. 5, the width of the lower portion 61 decreases s toward the upper portion 62. In other words, the side surfaces 61a and 61b of the lower portion 61 are inclined with respect to the third direction Z. Incidentally, the upper portion 62 includes an end portion 62a protruding from the side surface 61a and an end portion 62b protruding from the side surface 61b.

The amount D of protrusion of each of the end portions 62a and 62b from the side surfaces 61a and 61b (hereinafter, referred to as the amount of protrusion D of the partition 6) is, for example, less than or equal to 2.0 μm. In the embodiment, the amount of protrusion D of the partition 6 corresponds to the distance of the partition 6 between the lower ends of the side surfaces 61a and 61b (barrier layer 611) and the end portions 62a and 62b in a width direction (first direction X or second direction Y) orthogonal to the third direction Z.

In the example shown in FIG. 5, the side surface of the barrier layer 611 is aligned with the side surface of the metal layer 612, forming a flat surface with no steps but, for example, the side surface of the barrier layer 611 may be slightly recessed with respect to the side surface of the metal layer 612 or may protrude with respect to the side surface of the metal layer 612. In addition, in FIG. 5, the side surfaces of the barrier layer 611 and the metal layer 612 (i.e., the side surfaces 61a and 61b of the lower portion 61) are inclined with respect to the third direction Z, but these sides may also be parallel to the third direction Z.

The structure of the partition 6 and the materials of the portions of the partition 6 can be appropriately selected in consideration of, for example, the method for forming the partition 6, and the like.

In the present embodiment, the partition 6 is formed to divide the subpixels SP in plan view. The above-described organic layers OR are formed by, for example, a vacuum deposition method having anisotropy or directionality. When the organic material for forming each organic layer OR is deposited on the entire base 10 in a state in which the partition 6 is provided, the organic layers OR are not substantially formed on the side surfaces of the partition 6 since the partition 6 has the shape shown in FIG. 4 and FIG. 5. According to this, the organic layer OR (light emitting element) which is divided for each subpixel SP by the partition 6 can be formed.

Figure 6:
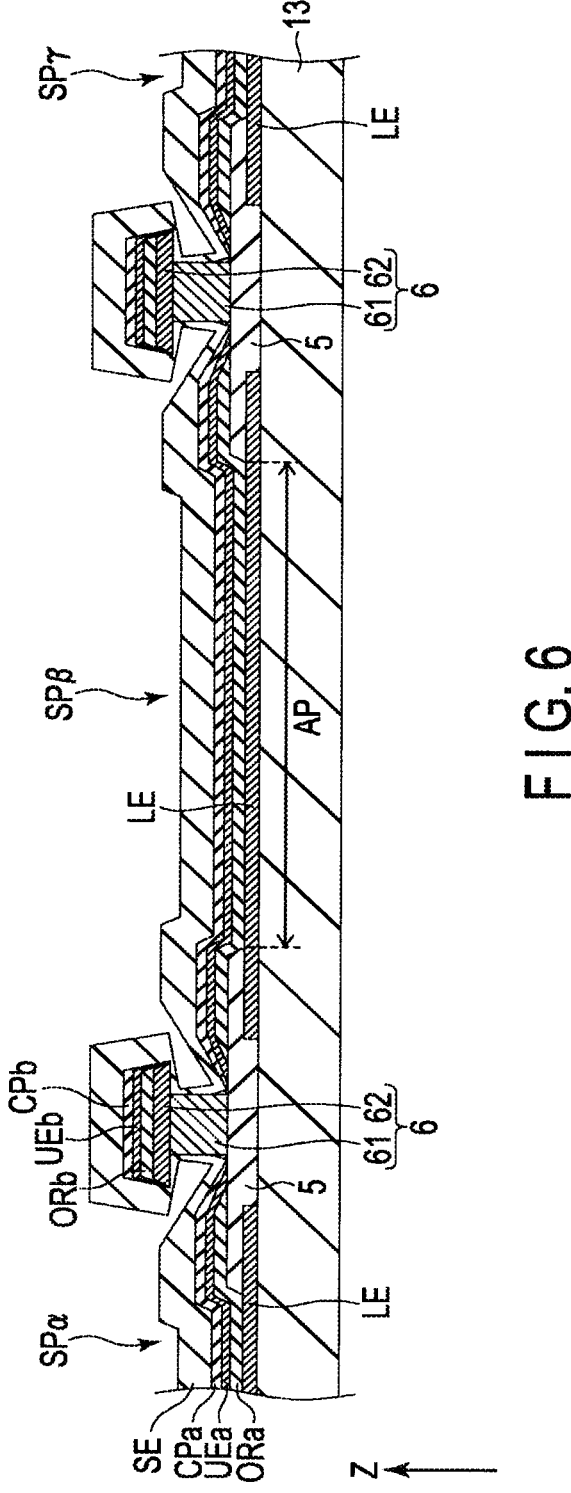
FIG. 6 is a schematic cross-sectional view illustrating the light emitting element formed using the partition.
Figure 7:
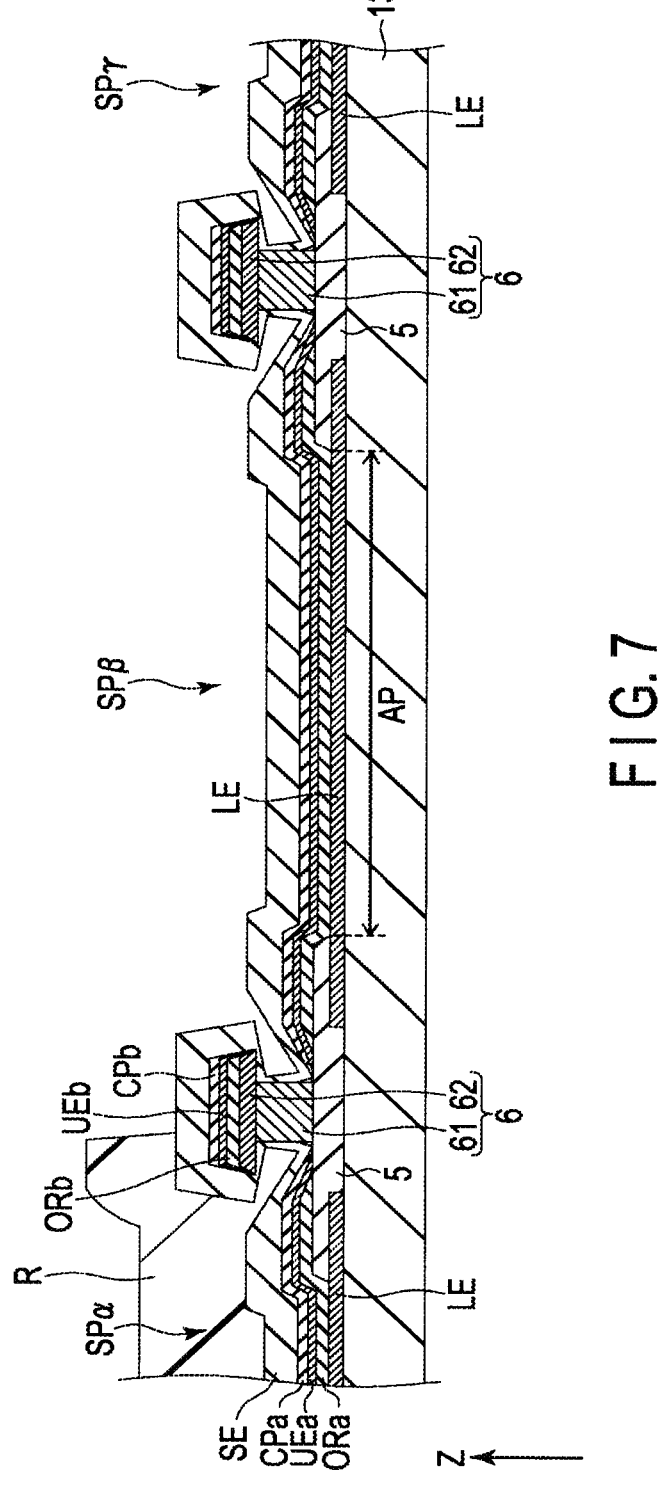
FIG. 7 is a schematic cross-sectional view illustrating the light emitting element formed using the partition.
Figure 8:
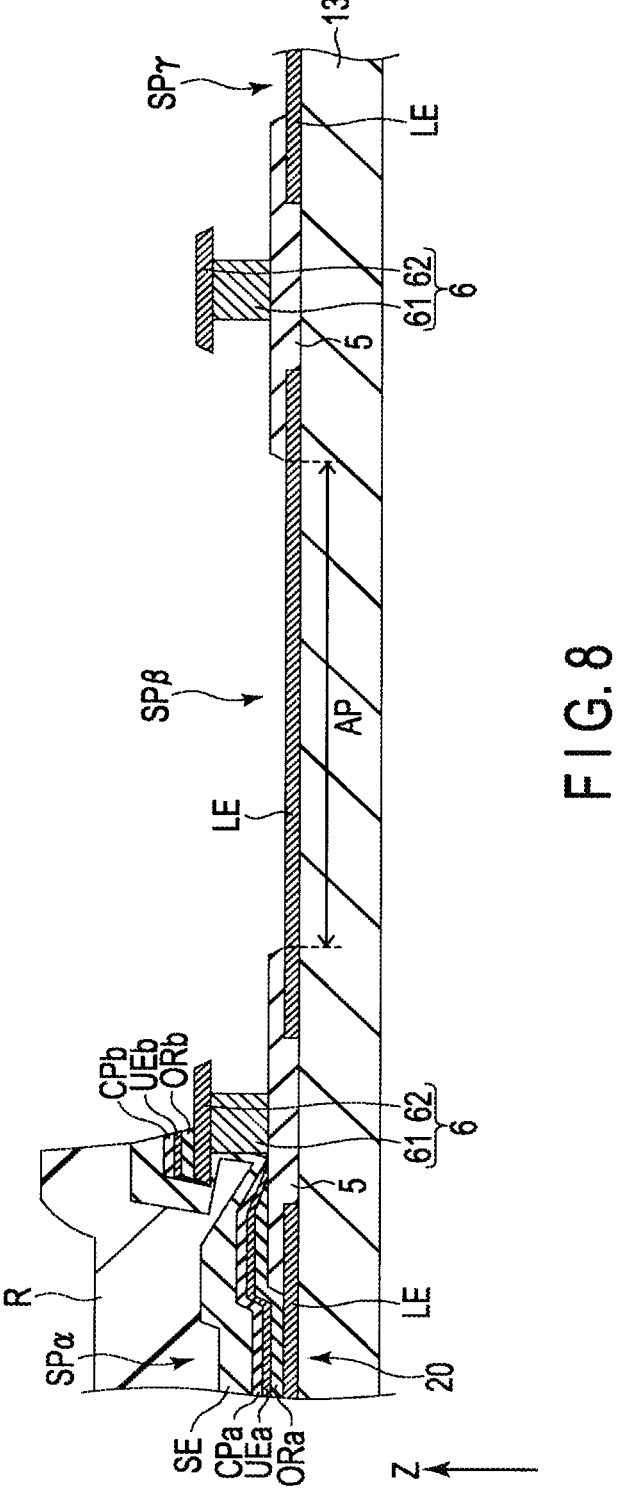
FIG. 8 is a schematic cross-sectional view illustrating the light emitting element formed using the partition.

FIG. 6 to FIG. 8 are schematic cross-sectional views illustrating the light emitting elements formed using the partition 6. Incidentally, in FIG. 6 to FIG. 8, the base 10, the insulating layer 11, and the circuit layer 12 are omitted. In addition, each of subpixels SPα, SPβ, and SPγ shown in FIG. 6 to FIG. 8 corresponds to one of the subpixels SP1, SP2 and SP3.

First, the organic layer OR, the upper electrode UE, the cap layer CP and the sealing layer SE are formed in order over the entire base 10 by vapor deposition as shown in FIG. 6, in a state in which the partition 6 is provided as described above. The organic layer OR includes a light emitting layer which emits light exhibiting a color corresponding to the subpixel SPα. The partition 6 having an overhang shape divides the organic layer OR into a first organic layer ORa which is in contact with the lower electrode LE through the aperture AP and a second organic layer ORb on the partition 6, divides the upper electrode UE into a first upper electrode UEa which covers the first organic layer ORa and a second upper electrode UEb which covers the second organic layer ORb, and divides the cap layer CP into a first cap layer CPa which covers the first upper electrode UEa and a second cap layer CPb which covers the second upper electrode UEb. The first upper electrode UEa is in contact with the lower portion 61 of the partition 6. The sealing layer SE continuously covers the first cap layer CPa, the partition 6, and the second cap layer CPb.

Next, a resist R is formed on the sealing layer SE as shown in FIG. 7. The resist R covers the subpixel Spα. In other words, the resist R is provided directly above the first organic layer ORa, the first upper electrode UEa, and the first cap layer CPa that are located in subpixel SPα. The resist R is also located directly above portions close to the subpixel SPα, of the second organic layer ORb, the second upper electrode UEb, and the second cap layer CPb on the partition 6 between the subpixel SPα and the subpixel SPβ. In other words, at least a part of the partition 6 is exposed from the resist R.

Furthermore, the portion exposed from the resist R is removed from the organic layer OR, the upper electrode UE, the cap layer CP and the sealing layer SE as shown in FIG. 8 by etching using the resist R as a mask. The light emitting element including the lower electrode LE, the first organic layer ORa, the first upper electrode UEa, and the first cap layer CPa is thereby formed in the subpixel SPα. In contrast, the lower electrode LE is exposed in the subpixels SPβ and SPγ. Incidentally, the above-described etching includes, for example, dry etching of the sealing layer SE, wet etching and dry etching of the cap layer CP, wet etching of the upper electrode UE, and dry etching of the organic layer OR.

When the light emitting element of the subpixel SPα is formed as described above, the resist R is removed, and the light emitting elements of the subpixels SPβ and SPγ are formed in series in the same manner as that of the subpixel SPα.

The structure of the display device DSP shown in FIG. 4 is realized by forming the light emitting elements of SP1, SP3 the subpixels SP2, and as exemplified above in relation to the subpixels SPα, SPβ, and SPγ and further forming the resin layer 14, the sealing layer 15, and the resin layer 16.

As described above, each of the plurality of subpixels SP includes the pixel circuit that drives the light emitting element. An example of the circuit configuration of the pixel circuit will be described below with reference to FIG. 9. Incidentally, a pixel circuit 100 shown in FIG. 9 is a 7Tr1C pixel circuit composed of seven transistors (hereafter referred to as first to seventh transistors) Tr1 to Tr7 and one storage capacitor Cst.

In the following descriptions, one of source/drain terminals of each of the first to seventh transistors Tr1 to Tr7 shown in FIG. 9 is referred to as a first terminal while the other is referred to as a second terminal. In addition, one of terminals of (a capacitive element realizing) the storage capacitor Cst shown in FIG. 9 is referred to as a first terminal while the other terminal is referred to as a second terminal.

The first terminal of the first transistor Tr1 is connected to the first terminal of the second transistor Tr2 and the second terminal of the fifth transistor Tr5 via a node n3. The second terminal of the first transistor Tr1 is connected to a data signal line that supplies a data signal Data. The data signal Data corresponds to a signal (pixel signal) written to the pixel. Incidentally, the first transistor Tr1 is, for example, an n-channel transistor.

The second transistor Tr2 corresponds to a drive transistor (DRT) that supplies a current to the light emitting element 20 included in the subpixel SP (i.e., the light emitting element 20 driven by the pixel circuit 100). The first terminal of the second transistor Tr2 is connected to the first terminal of the first transistor Tr1 and the second terminal of the fifth transistor Tr5 via the node n3. The second terminal of the second transistor Tr2 is connected to the second terminal of the third transistor Tr3, the first terminal of the fourth transistor Tr4, and the first terminal of the seventh transistor Tr7 via the node n1. Incidentally, the second transistor Tr2 is, for example, an n-channel transistor.

The first terminal of the third transistor Tr3 is connected to the gate terminal of the second transistor Tr2 and the second terminal of the storage capacitor Cst via a node n2. The second terminal of the third transistor Tr3 is connected to the second terminal of the second transistor Tr2, the first terminal of the fourth transistor Tr4, and the first terminal of the seventh transistor Tr7 via the node n1. Incidentally, the third transistor Tr3 is, for example, an n-channel transistor.

The first terminal of the fourth transistor Tr4 is connected to the second terminal of the second transistor Tr2, the second terminal of the second transistor Tr2, the second terminal of the third transistor Tr3, and the first terminal of the seventh transistor Tr7 via the node n1. The second terminal of the fourth transistor Tr4 is connected to a power supply line that supplies a power supply voltage VDDEL. Incidentally, the fourth transistor Tr4 is, for example, a p-channel transistor.

The first terminal of the fifth transistor Tr5 is connected to the first terminal of the sixth transistor Tr6, the first terminal of the storage capacitor Cst, and the anode terminal of the light emitting element 20 via a node n4. The second terminal of the fifth transistor Tr5 is connected to the first terminal of the first transistor Tr1 and the first terminal of the second transistor Tr2 via the node n3. Incidentally, the fifth transistor Tr5 is, for example, a p-channel transistor.

The first terminal of the sixth transistor Tr6 is connected to the first terminal of the fifth transistor Tr5, the 1 first terminal of the storage capacitor Cst, and the anode terminal of the light emitting element 20 via the node n4. The second terminal of the sixth transistor Tr6 is connected to the power supply line that supplies an initialization voltage Vini. Incidentally, the sixth transistor Tr6 is, for example, an n-channel transistor.

The first terminal of the seventh transistor Tr7 is connected to the second terminal of the second transistor Tr2, the second terminal of the third transistor Tr3, and the first terminal of the fourth transistor Tr4 via the node n1. The second terminal of the seventh transistor Tr7 is connected to the power supply line that supplies a power supply voltage VSH. Incidentally, the seventh transistor Tr7 is, for example, an n-channel transistor.

In addition, as shown in FIG. 9, the gate terminal of the first transistor Tr1 is connected to the gate signal line that supplies a gate signal Scan2. The gate terminal of the third transistor Tr3 is connected to the gate signal line that supplies a gate signal Scan1. The gate terminals of the fourth to sixth transistors Tr4 to Tr6 are connected to the control signal line that supplies a control signal EM. The gate terminal of the seventh transistor Tr7 is connected to the gate signal line that supplies a gate signal Scan3.

The first terminal of the storage capacitor Cst is connected to the first terminal of the fifth transistor Tr5, the first terminal of the sixth transistor Tr6, and the anode terminal of the light emitting element 20 via the node n4. The second terminal of the storage capacitor Cst is connected to the gate terminal of the second transistor Tr2 and the first terminal of the third transistor Tr3 via the node n2.

The anode terminal of the light emitting element 20 is connected to the first terminal of the fifth transistor Tr5, the first terminal of the sixth transistor Tr6, and the first terminal of the storage capacitor Cst via the node n4. The cathode terminal of the light emitting element 20 is connected to the power supply line that supplies a power supply voltage VSSEL. The above-mentioned power supply voltage VDDEL corresponds to the anode voltage supplied to the light emitting element 20, and the power supply voltage VSSEL corresponds to the cathode voltage supplied to the light emitting element 20.

Although not shown in FIG. 9, for example, the data signal line that supplies the data signal Data, the power supply line that supplies the power supply voltage VDDEL, and the power supply line that supplies the power supply voltage VSH are arranged in the first direction X to extend in the second direction Y. In other words, the data signal line, the power supply line that supplies the power supply voltage VDDEL, and the power supply line that supplies the power supply voltage VSH are connected to each of the plurality of subpixels SP (pixel circuits 100) arranged in the second direction Y. In addition, for example, the gate signal lines that supply the gate signals Scan1 to Scan3, the control signal line that supplies the control signal EM, and the power supply line that supplies the initialization voltage Vini are arranged in the second direction Y to extend in the first direction X. In other words, the gate signal lines, the control signal line, and the power supply line that supplies the initialization voltage Vini are connected to each of the plurality of subpixels SP (pixel circuits 100) arranged in the first direction X.

Incidentally, in the display device DSP, the pixel circuit 100 can display various screens (images) in the display area DA by driving the light emitting element 20 included in each of the plurality of subpixels SP, but for example, when the entire screen displayed in the display area DA is to be darkened, the light emitting element 20 included in each of the plurality of subpixels SP is considered to emit light at low luminance. However, if the light emitting element 20 included in each of the plurality of subpixels SP are made to emit light at low luminance, it is likely that irregularities will occur on the screen.

For this reason, in the display device DSP, pulse width modulation (PWM) drive of making the light emitting elements 20 emit light (turn on) at high luminance and in time division, can be applied instead of making the light emitting elements 20 emit light (turn on) at low luminance for the entire period, in order to avoid irregularities occurring on the screen.

Figure 10:
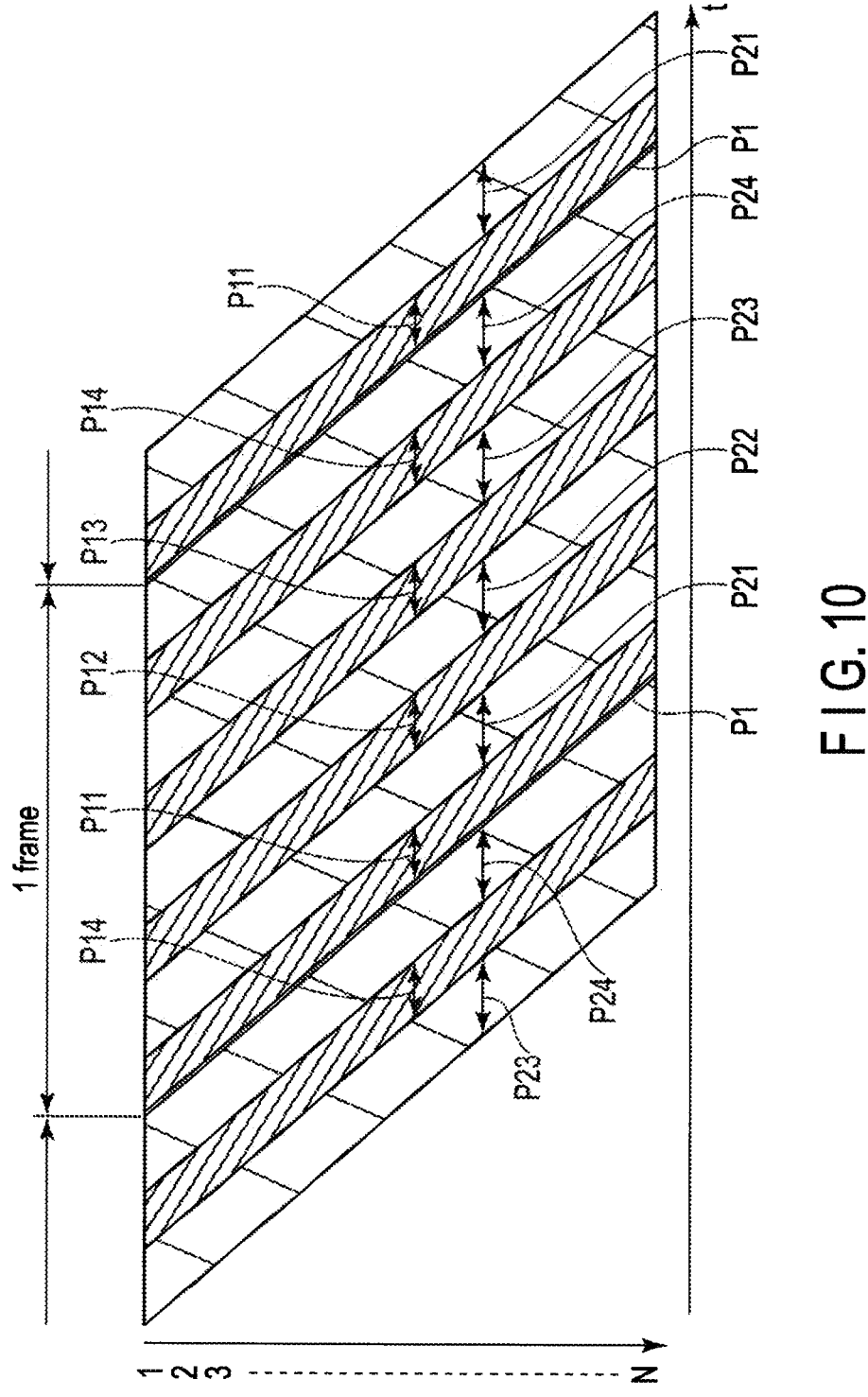
FIG. 10 is a view showing an outline of PWM drive.

FIG. 10 shows an outline of the PWM drive. In FIG. 10, a vertical axis represents 1 to N lines composed of the plurality of pixels PX (subpixels SP) arranged in the display area DA (hereafter referred to as 1 to N lines in the display area DA), and a horizontal axis represents time. In this case, N is an integer of 2 or more.

In the PWM drive, the data signal Data is written to each line of the display area DA every frame period to display one frame (images). Incidentally, the data signal Data is written in order of the 1 to N lines in the display area DA.

In addition, in the PWM drive, after the data signal Data is written to each line in the display area DA, the light emitting elements 20 included in the pixels PX (subpixels SP) constituting each line are repeatedly turned on and off (in other words, the light emitting elements 20 are turned on and off in time division).

In the example shown in FIG. 10, a write scan period P1 in which the data signal Data is written to each of the 1 to N lines, first to fourth emission periods P11 to P14 in which the light emitting elements 20 are turned on, and the first to fourth non-emission periods P21 to P24 in which the light emitting elements 20 are turned off, are set in one frame period, and the light emitting elements 20 are repeatedly turned on four times and turned off four times in the PWM drive.

Incidentally, FIG. 10 shows an example in which the light emitting elements 20 are repeatedly turned on four times and turned off four times, but the number of times of repeatedly turning on and turning off may be other than four.

According to the PWM drive, compared to a drive method (normal drive) of turning on the light emitting element 20 at low luminance for the entire one frame period (i.e., a period other than the write scanning period P1), for example, it is easier to control the current supplied to the light emitting element 20 via the drive transistor DRT (the second transistor Tr2 shown in FIG. 9), and it is less likely to cause unevenness on the screen displayed in the display area DA.

In addition, since the PWM drive can adjust the luminance of the screen by, for example, changing the ratio of the first to fourth emission periods P11 to P14 in one frame period, it is possible to easily adjust the luminance without changing, for example, the data signal (image data). In addition, the PWM drive may also be used to correct irregularities (unevenness in image quality) that occur in low-gradation screens (images).

The operation of the pixel circuit 100 shown in FIG. 9 during the PWM drive will be described with reference to FIG. 11. FIG. 11 is a timing chart showing an example of output of the gate signals Scan1 to Scan3 and the control signal EM for the subpixels SP (pixel circuit 100) arranged in n-1-th and n-th lines among 1 to N lines of the display area DA described above. Incidentally, n is an integer greater than or equal to 2 and less than or equal to N.

The operations of the pixel circuit 100 during the fourth emission period P14, the fourth non-emission period P24, and the write scanning period P1 that are arranged in one frame period, and the first emission period P11 that is arranged in a subsequent frame period as shown in FIG. 10 will be described.

Incidentally, the plurality of transistors constituting the pixel circuit 100 include the n-channel transistors and p-channel transistors, and the n-channel transistor is a switching element which is turned off (non-conductive) when a low (level) signal is supplied to the gate terminal and which is turned on (conductive) when a high (level) signal is supplied to the gate terminal. In contrast, the p-channel transistor is a switching element which is turned off (non-conductive) when a high (level) signal is supplied to the gate terminal and which is turned on (conductive) when a low (level) signal is supplied to the gate terminal.

First, in the fourth emission period P14 shown in FIG. 11, the fourth transistor Tr4 and the fifth transistor Tr5 of seven transistors included in the pixel circuit 100 are in the on state, and the sixth transistor Tr6 is in the off state since the control signal EM is low.

In addition, in the fourth emission period P14, the first transistor Tr1, the third transistor Tr3, and the seventh transistor Tr7 are in the off state since the gate signals Scan1 to Scan3 are low.

According to this, the current controlled by the gate voltage of the second transistor Tr2 (i.e., the voltage supplied to the gate terminal of the second transistor Tr2 based on the data signal Data of the previous frame) is supplied to the light emitting element 20 (OLED), and the light emitting element 20 emits light.

Next, the control signal EM is switched from low to high at the timing when the fourth non-emission period P24 shown in FIG. 11 starts.

According to this, since the fourth transistor Tr4 and the fifth transistor Tr5 become an off state, no current is supplied to the light emitting element 20, and the light emitting element 20 is turned off.

Next, the sixth transistor Tr6 is in the on state during the period P1a in the write scanning period P1 shown in FIG. 11 since the control signal EM is high. In this case, the initialization voltage Vini is supplied to the node n4 via the sixth transistor Tr6, but no current flows to the light emitting element 20 during the period P1a (in other words, the light emitting element 20 does not emit light) since the initialization voltage Vini is set to a value at which no current flows to the light emitting element 20.

In addition, the gate signal Scan1 is switched from low to high at the timing of start of the period P1a. For this reason, the transistor Tr3 becomes the on state during the period P1a. Furthermore, the gate signal Scan3 is switched from low to high at the timing of start of the write scanning period P1. For this reason, the seventh transistor Tr7 becomes the on state during the period P1a. According to this, the power supply voltage VSH is supplied to the gate terminal of the second transistor Tr2 via the seventh transistor Tr7 and the third transistor Tr3. In this case, a voltage VSH-Vini is applied to (an interval between first and second terminals between) the storage capacitor Cst, and the information of the previous frame is reset.

Incidentally, the gate signal Scan3 is switched from high to low at the timing of end of the period P1a.

In addition, the gate signal Scan2 is switched from low to high at the timing of start of the period P1b of the write scanning period P1. For this reason, the first transistor Tr1 becomes the on state during the period P1b. In addition, the seventh transistor Tr7 is in the off state during the period P1b since the gate signal Scan3 is low.

In this case, (the voltage Vdata corresponding to) the data signal Data and the threshold voltage Vth of the second transistor Tr2 (i.e., the voltage corresponding to Vdata+Vth) are supplied to the gate terminal of the second transistor Tr2 via the first transistor Tr1, the second transistor Tr2, and the third transistor Tr3. According to this, the voltage of Vdath+ Vth−Vini is applied to the storage capacitor Cst, and the information regarding Vdath and Vth is written to the storage capacitor Cst (in other words, the voltage that controls the current supplied to the light emitting element 20 by the second transistor Tr2 is held in the storage capacitor Cst).

Incidentally, the gate signal Scan1 is switched from high to low at the timing of end of the period P1b.

Next, the third transistor Tr3 is in the off state during the first emission period P11 shown in FIG. 11 since the gate signal Scan1 is low. In addition, the first transistor Tr1 is in the off state since the gate signal Scan2 is switched from high to low before the first emission period P11 starts. Furthermore, the control signal EM is switched from high to low at the timing when the first emission period P11 starts. For this reason, the fourth transistor Tr4 and the fifth transistor Tr5 become the on state, and the sixth transistor Tr6 becomes the off state.

If the first terminal of the second transistor Tr2 is assumed to be the source terminal, a voltage Vgs between the gate terminal and source terminal (nodes n2 to n3) of the second transistor Tr2 becomes the voltage of the storage capacity Cst (Vdata+Vth−Vini). In this case, the second transistor Tr2 becomes the on state, and a current flows from the power line connected to the second terminal of the fourth transistor Tr4 (i.e., the power line that supplies the power supply voltage VDDEL) to the node n4. In response to this, when rise in the potential at the node n4 starts and the potential exceeds the threshold value of the light emitting element 20 (OLED), a current starts flowing to the light emitting element 20 and the light emission from the light emitting element 20 is started. Finally, when the current Ioled flowing to the light emitting element 20 reaches the output current (output current in the saturation region of the second transistor Tr2) Idrt supplied by the second transistor Tr2, the rise in the potential at the node n4 stops and the light emitting element 20 enters a steady-state emission state.

Incidentally, if the voltage between the gate and source terminals of the second transistor Tr2 Vgs=Vdata+Vth−Vini is substituted into the TFT saturation equation Idrt=1/ 2Cox*μ*W/L*(Vgs−Vth)2, we get Idrt (=Ioled)=1/ 2Cox*μ*W/L*(Vdata−Vini)2 can be obtained. Cox is a gate capacitance per unit area, μ is the carrier mobility, W is a channel width of the second transistor Tr2, and L is a channel length of the second transistor Tr2.

According to this, it can be understood that Idrts becomes a value that does not depend on the threshold voltage Vth of the second transistor Tr2 (in other words, a current that does not depend on the threshold voltage Vth of the second transistor Tr2 flows to the light emitting element 20), and that the variation in the threshold voltage Vth can eliminate an influence given to Idrts.

In other words, it can be said that the pixel circuit 100 (7Tr1C pixel circuit) shown in FIG. 9 includes a function (Vth correction function) of correcting the variation in the threshold voltage Vth of the second transistor Tr2.

The operation of the pixel circuit 100 provided in the n-1-th line as shown in FIG. 11 has been described, and the pixel circuit 100 provided in the n-th line performs the same operation so as to write the data signal Data to the n-th line after writing the data signal Data to the n-1th line.

Displaying a screen (window) as shown on the left side of FIG. 12 in the display area DA of the display device DSP to which the above-described PWM drive will be considered below. Incidentally, a black band portion 101 (black band-shaped image) is arranged in the center of the screen shown on the left side of FIG. 12. In this case, the n-1-th line in the above-described display area DA corresponds to a line that displays the black band portion 101, and the n-th line corresponds to a line that displays a portion (non-black band portion) different from the black band portion 101 located in the second direction Y with respect to the black band portion 101.

In the following descriptions, for convenience, an operation of the pixel circuit 100 during the fourth emission period P14 is referred to as an emission operation, an operation of the pixel circuit 100 during the fourth non-emission period P24 is referred to as a non-emission operation, and an operation of the pixel circuit 100 during the write scanning period P1 is referred to as a write operation.

When the pixel circuit 100 arranged in the n-1-th line performs the write operation, (a black voltage corresponding to) the data signal Data for displaying the black band portion 101 is supplied to the data signal line to which the first transistor Tr1 constituting the pixel circuit 100 arranged in the n-1-th line is connected. In the present embodiment, the black voltage corresponds to a voltage that does not cause the light emitting element 20 to emit light (i.e., a voltage that does not cause a current to flow through the light emitting element 20).

In contrast, as described above, the first transistor Tr1 constituting the pixel circuit 100 arranged in the n-th line is also connected to the data signal line to which the data signal Data for displaying the black band portion 101 is supplied. When the pixel circuit 100 arranged in the n-1-th line is performing the write operation, the pixel circuit 100 arranged in the n-th line is performing the non-emission operation, and the nodes n1 and n3 of the pixel circuit 100 arranged in the n-th line are in a floating state.

In a case where the nodes n1 and n3 of the pixel circuit 100 arranged in the n-th line are thus in a floating state, if the data signal Data (i.e., black voltage) is supplied to the data signal line connected to the first transistor Tr1 constituting the pixel circuit 100 as described above, a leakage current (OFF leakage) which is to flow from the node n3 side toward the data signal line side flows to the data signal line, and a potential fluctuation occurs at the nodes n1 and n3 in the floating state.

The pixel circuit 100 arranged in the n-th line performs the write operation after the non-emission operation, but the potential fluctuations that occur at the nodes n1 and n3 during the non-emission operation also affects the gate voltage of the second transistor Tr2 after the write operation (i.e., remains as a potential difference in the gate voltage). For this reason, when a screen shown on the left side of FIG. 12 is displayed in the display area DA of the display device DSP to which PWM drive is applied, a ghost is visually recognized (occurs) in, for example, the area 102 after the n-th line, where the write operation is performed after the n-1-th line of the display area DA, as shown on the right side of FIG. 12.

Since the occurrence of the ghost is caused by the fact that the data signal (black voltage) Data for displaying the black band portion 101 is supplied to the data signal line during the non-emission period (i.e. while the nodes n1 and n3 are in a floating state), this ghost does not occur in the display device DSP to which the above-described normal drive is applied (i.e. where no non-emission period is arranged in a frame period).

Figure 13:
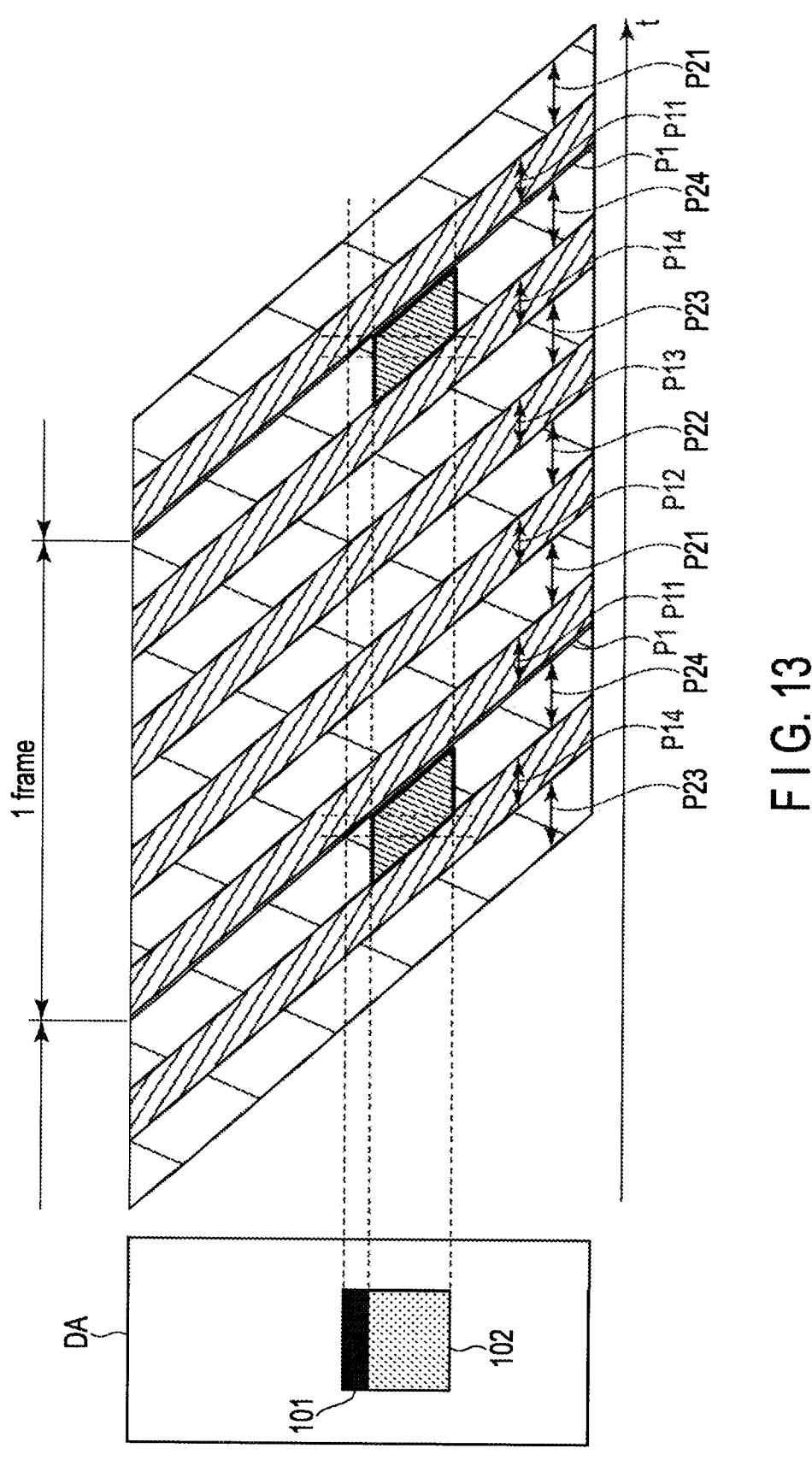
FIG. 13 is a view illustrating an area where ghosting can occur.

As described above, the area 102 where the ghost occurs is an area composed of pixels PX (subpixels SP) where the data signal Data to display the black band portion 101 during the fourth non-emission period P24, which is arranged immediately before the write scanning period P1, is supplied to the data signal line as shown in FIG. 13. In other words, the area 102 where the ghost occurs is an area where at least part of the fourth non-emission period P24 overlaps with the period when writing the black band portion 101 is performed.

As described above, when the screen where the black band portion 101 is arranged is displayed in the display area DA on the display device DSP to which the PWM drive is applied, a ghost may occur, which may degrade the display quality in the display device DSP. It has been described for convenience that the black band portion 101 (a black band-shaped image) is displayed in a part of the display area DA but, when a band-shaped image of the other color is displayed, a ghost may occur similarly, which may cause degradation in display quality of the display device DSP.

In this example, in general, the first transistor Tr1 constituting the pixel circuit 100 is, for example, a polysilicon transistor using low temperature polysilicon (LTP). In the present embodiment, the occurrence of the above-described ghost in response to the leakage current that occurs in the first transistor Tr1 transistor Tr1 is focused, and an oxide transistor that (oxide TFT) uses an oxide semiconductor is adopted as the first transistor Tr1. A leakage current of an oxide transistor is extremely low as compared to that of a polysilicon transistor. Even if the data signal (black voltage) for displaying the black band portion 101 is supplied to the data signal line during the above-described non-emission operation, there is no potential fluctuation at the nodes n1 and n3 in the pixel circuit 100 arranged in the above-mentioned area 102, and the occurrence of ghosts can be suppressed.

FIG. 14 shows an example of the layout of the pixel circuit 100. FIG. 14 shows, for example, various elements (transistors Tr1 to Tr7, storage capacitor Cst, gate signal line, control signal line, data signal line, and various power supply lines) of the pixel circuit 100 formed in the circuit layer 12 composed of first to fifth layers.

Incidentally, it is assumed that the first layer is a layer formed under the second layer, that the second layer is a layer formed under the third layer, that the third layer is a layer formed under the fourth layer, and that the fourth layer is a layer formed under the fifth layer. In other words, it is assumed that the first to fifth layers are stacked in order with the first layer being the bottom layer and the fifth layer being the top layer.

In addition, the first layer is the layer (p-Si layer) in which the polysilicon semiconductor layer is formed, the second, fourth, and fifth layers are the layers (metal layers) in which the electrodes constituting the transistors, the wires connected to the transistors, and the like are formed, and the third layer is the layer (oxide layer) in which the oxide semiconductor layer is formed.

More specifically, the first transistor Tr1, which is an oxide transistor, is formed across the second to fourth layers, as shown in FIG. 14. In this example, it is assumed that the first transistor Tr1 has a dual-gate structure in which the oxide semiconductor is sandwiched between the first gate electrode formed in the fourth layer (upper layer) and the second gate electrode formed in the second layer (lower layer) (i.e., in the third layer).

Incidentally, in order to appropriately hold the voltage supplied to the gate terminal of the second transistor Tr2 during a single frame period in the storage capacitor Cst, an oxide transistor is often used as the third transistor Tr3 connected to the node n2.

In contrast, the second transistor Tr2 and the fourth to seventh transistors Tr4 to Tr7 are polysilicon transistors, and are formed across the first and second layers. In other words, the second transistor Tr2 and the fourth to seventh transistors Tr4 to Tr7 are formed in a lower layer than the first transistor Tr1 and the third transistor Tr3 (oxide transistor). Similarly to the second transistor Tr2 and the fourth to seventh transistors Tr4 to Tr7, the storage capacitor Cst is formed across the first and second layers.

In addition, the gate signal line, the control signal line, and the power supply line that supplies the initialization voltage Vini are formed in the second layer. Furthermore, the data signal line and other power supply lines are formed in the fifth layer.

The above-described connections between the elements of the pixel circuit 100 have been described above with reference to FIG. 9 and their detailed descriptions will be omitted here. As shown in FIG. 14, the elements formed in different layers are connected via contact holes CH.

In addition, it has been described with reference to FIG. 14 that all of the second transistor Tr2 and the fourth to seventh transistors Tr4 to Tr7 are polysilicon transistors, but some of the second transistor Tr2 and the fourth to seventh transistors Tr4 to Tr7 may be oxide transistors. More specifically, for example, polysilicon transistors with relatively high stability may be employed as the second transistor Tr2, the fourth transistor Tr4, and the fifth transistor Tr5, which supply a current to the light emitting element 20, and an oxide transistor may be employed as the other sixth transistor Tr6 and seventh transistor Tr7.

Incidentally, the layout of the pixel circuit 100 shown in FIG. 14 is an example, and the positions and orientations at which the elements of the pixel circuit 100 are arranged may be different from those in the example shown in FIG. 14.

As described above, the display device DSP of the present embodiment includes the base 10, the plurality of subpixels SP arranged in the display area DA on the base 10, and the data signal line that supplies the data signal Data to each of the plurality of subpixels SP. Each of the plurality of subpixels SP includes the pixel circuit 100 composed of a plurality of transistors and the light emitting element 20 driven by the pixel circuit 100. In addition, the pixel circuit 100 drives the light emitting element 20 to emit light in time division. Furthermore, first transistor Tr1 connected to the data signal line, among the plurality of transistors that constitute the pixel circuit 100, is an oxide transistor.

In the present embodiment, with the above-described configuration, it is possible to suppress the degradation in display quality of the display device DSP (in other words, to achieve good display quality without ghost) even if a screen in which the black band portion 101 and the like are arranged is displayed in the display area DA of the display device DSP to which the PWM drive is applied.

In addition, in the present embodiment, since the second transistor Tr2 which supplies a current to the light emitting element 20, among the plurality of transistors constituting the pixel circuit 100, is a polysilicon transistor, it is possible to supply a stable current to the light emitting element 20. In the present embodiment, the fourth transistor Tr4 provided between the power supply line supplying the power supply voltage VDDEL and the second transistor Tr2, and the fifth transistor Tr5 provided between the light emitting element 20 and the second transistor Tr2 are also, desirably, poly-silicon transistors.

Furthermore, in the present embodiment, the first terminal (one of the source and drain terminals) of the second transistor Tr2 is connected to the first terminal of the first transistor Tr1, and the third transistor Tr3 having the first terminal (one of the source and drain terminals) connected to the gate terminal of the second transistor Tr2 and the second terminal (one of the terminals) of the storage capacitor Cst, and having the second terminal (the other of the source and drain terminals) connected to the second terminal (the other of the source and drain terminals) of the second transistor Tr2, is an oxide transistor. Therefore, the voltage supplied to the gate terminal of the second transistor Tr2 can be appropriately held in the holding capacity Cst without being affected by a leakage current.

In the present embodiment, it has been described that the first transistor Tr1 connected to the data signal line is an oxide transistor, but the first transistor Tr1 may be a transistor configured to have a lower leakage current as compared to, for example, the second transistor that supplies a current to the light emitting element 20, among the plurality of transistors constituting the pixel circuit 100.

Various modifications are easily conceivable within the category of the idea of the present disclosure by a person of ordinary skill in the art, and these modifications are also considered to belong to the scope of the present disclosure. For example, additions, deletions or changes in design of the constituent elements or additions, omissions or changes in condition of the processes may be arbitrarily made to the above embodiments by a person of ordinary skill in the art, and these modifications also fall within the scope of the present disclosure.

In addition, the other advantages of the aspects described in the above embodiments, which are obvious from the descriptions of the specification and the corresponding drawings.

What is claimed is:

1. A display device, comprising:
a base;
a plurality of pixels in a display area (DA) on the base; and
a data signal line to supply a data signal to each of the plurality of pixels, wherein
each of the plurality of pixels includes a pixel circuit having a plurality of transistors and a light emitting element drivable by the pixel circuit,
the pixel circuit is configured to drive the light emitting element to emit light according to pulse width modulation,
a first transistor is connected to the data signal line, among the plurality of transistors in the pixel circuit,
the plurality of transistors include a second transistor to supply current to the light emitting element,
the first transistor has a smaller leak current compared to the second transistor,
the pixel circuit further includes a storage capacitor to hold a voltage to control the current supplied by the second transistor to the light emitting element,
in the second transistor, one of a source terminal and a drain terminal is connected to one of a source terminal and a drain terminal of the first transistor,
fourth and fifth transistors among the plurality of transistors in the pixel circuit are polysilicon transistors, the fourth transistor is between a power supply line to supply a power supply voltage (VDDEL) and the second transistor,
the fifth transistor is between the light emitting element and the second transistor,
the pixel circuit is formed in a circuit layer having a first layer, a second layer, a third layer, a fourth layer, and a fifth layer,
the first to fifth layers are stacked in order with the first layer being a bottom layer of the stack and the fifth layer being a top layer of the stack,
the first layer is a p-Si layer, the second, fourth, and fifth layers are metal layers, and the third layer is an oxide layer,
the first transistor is formed across the second to fourth layers, the second, fourth, and fifth transistors are formed across the first and second layers, and
the storage capacitor is formed across the first and second layers.

2. The display device of claim 1, wherein
the first transistor is an oxide transistor, and
the second transistor is a polysilicon transistor.

3. The display device of claim 1, wherein
a third transistor among the plurality of transistors in the pixel circuit is an oxide transistor, and
in the third transistor, one of a source terminal and a drain terminal is connected to one of a gate terminal of the second transistor and a terminal of the storage capacitor, and the other of the source terminal and the drain terminal is connected to the other of the source terminal and the drain terminal of the second transistor.

4. A display device, comprising:
a base;
a plurality of pixels in a display area (DA) on the base; and
a data signal line to supply a data signal to each of the plurality of pixels, wherein
each of the plurality of pixels includes a pixel circuit having a plurality of transistors and a light emitting element drivable by the pixel circuit,
the pixel circuit is configured to drive the light emitting element to emit light according to pulse width modulation,
a first transistor is connected to the data signal line, among the plurality of transistors in the pixel circuit,
the plurality of transistors include a second transistor to supply current to the light emitting element,
the pixel circuit is formed in a circuit layer having a first layer, a second layer, a third layer, a fourth layer, and a fifth layer,
the first to fifth layers are stacked in order with the first layer being a bottom layer of the stack and the fifth layer being a top layer of the stack,
the first transistor is formed across the second to fourth layers,
the second transistor is formed across the first and second layers, and
the first transistor has a dual-gate structure sandwiched between a first gate electrode in one of the first to fifth layers and a second gate electrode in a different one of the first to fifth layers.

5. The display device of claim 4, wherein
a gate signal line, a control signal line, and a power supply line to supply an initialization voltage are formed in the second layer, and
the data signal line is formed in the fifth layer.

6. The display device of claim 4, wherein
the first layer is a p-Si layer, the second, fourth, and fifth layers are metal layers, and the third layer is an oxide layer.

7. The display device of claim 4, wherein
the pixel circuit further includes a storage capacitor to hold a voltage to control the current supplied by the second transistor to the light emitting element,
a third transistor among the plurality of transistors in the pixel circuit is an oxide transistor,
in the second transistor, one of a source terminal and a drain terminal is connected to one of a source terminal and a drain terminal of the first transistor, and
in the third transistor, one of a source terminal and a drain terminal is connected to one of a gate terminal of the second transistor and a terminal of the storage capacitor, and the other of the source terminal and the drain terminal is connected to the other of the source terminal and the drain terminal of the second transistor.

8. The display device of claim 7, wherein
the second, fourth, and fifth transistors are formed across the first and second layers, and
the storage capacitor is formed across the first and second layers.

9. A display device, comprising:
a base;
a plurality of pixels in a display area (DA) on the base; and
a data signal line to supply a data signal to each of the plurality of pixels, wherein
each of the plurality of pixels includes a pixel circuit having a plurality of transistors and a light emitting element drivable by the pixel circuit,
the pixel circuit is configured to drive the light emitting element to emit light according to pulse width modulation,
a first transistor is connected to the data signal line, among the plurality of transistors in the pixel circuit,
the plurality of transistors include a second transistor to supply current to the light emitting element,
the pixel circuit is formed in a circuit layer having a first layer, a second layer, a third layer, a fourth layer, and a fifth layer,
the first to fifth layers are stacked in order with the first layer being a bottom layer of the stack and the fifth layer being a top layer of the stack,
the first transistor is formed across the second to fourth layers,
the second transistor is formed across the first and second layers, and
the first layer is a p-Si layer, the second, fourth, and fifth layers are metal layers, and the third layer is an oxide layer.

10. The display device of claim 9, wherein
a gate signal line, a control signal line, and a power supply line to supply an initialization voltage are formed in the second layer, and
the data signal line is formed in the fifth layer.

11. The display device of claim 9, wherein
the pixel circuit further includes a storage capacitor to hold a voltage to control the current supplied by the second transistor to the light emitting element,
a third transistor among the plurality of transistors in the pixel circuit is an oxide transistor,
in the second transistor, one of a source terminal and a drain terminal is connected to one of a source terminal and a drain terminal of the first transistor, and in the third transistor, one of a source terminal and a drain terminal is connected to one of a gate terminal of the second transistor and a terminal of the storage capacitor, and the other of the source terminal and the drain terminal is connected to the other of the source terminal and the drain terminal of the second transistor.

12. The display device of claim 11, wherein
the second, fourth, and fifth transistors are formed across the first and second layers, and
the storage capacitor is formed across the first and second layers.

13. A display device, comprising:
a base;
a plurality of pixels in a display area (DA) on the base; and
a data signal line to supply a data signal to each of the plurality of pixels, wherein
each of the plurality of pixels includes a pixel circuit having a plurality of transistors and a light emitting element drivable by the pixel circuit,
the pixel circuit is configured to drive the light emitting element to emit light according to pulse width modulation,
a first transistor is connected to the data signal line, among the plurality of transistors in the pixel circuit,
the plurality of transistors include a second transistor to supply current to the light emitting element,
the pixel circuit is formed in a circuit layer having a first layer, a second layer, a third layer, a fourth layer, and a fifth layer,
the first to fifth layers are stacked in order with the first layer being a bottom layer of the stack and the fifth layer being a top layer of the stack,
the first transistor is formed across the second to fourth layers,
the second transistor is formed across the first and second layers,
a gate signal line, a control signal line, and a power supply line to supply an initialization voltage are formed in the second layer, and
the data signal line is formed in the fifth layer.

14. A display device, comprising:
a base;
a plurality of pixels in a display area (DA) on the base; and
a data signal line to supply a data signal to each of the plurality of pixels, wherein
each of the plurality of pixels includes a pixel circuit having a plurality of transistors and a light emitting element drivable by the pixel circuit,
the pixel circuit is configured to drive the light emitting element to emit light according to pulse width modulation,
a first transistor is connected to the data signal line, among the plurality of transistors in the pixel circuit,
the plurality of transistors include a second transistor to supply current to the light emitting element,
the pixel circuit is formed in a circuit layer having a first layer, a second layer, a third layer, a fourth layer, and a fifth layer,
the first to fifth layers are stacked in order with the first layer being a bottom layer of the stack and the fifth layer being a top layer of the stack,
the first transistor is formed across the second to fourth layers,
the second transistor is formed across the first and second layers, the pixel circuit further includes a storage capacitor to hold a voltage to control the current supplied by the second transistor to the light emitting element, a third transistor among the plurality of transistors in the pixel circuit is an oxide transistor, in the second transistor, one of a source terminal and a drain terminal is connected to one of a source terminal and a drain terminal of the first transistor, in the third transistor, one of a source terminal and a drain terminal is connected to one of a gate terminal of the second transistor and a terminal of the storage capacitor, and the other of the source terminal and the drain terminal is connected to the other of the source terminal and the drain terminal of the second transistor, the second, fourth, and fifth transistors are formed across the first and second layers, and the storage capacitor is formed across the first and second layers.

* * * * *